US012701725B2

(12) United States Patent
Zhou et al.

(10) Patent No.: US 12,701,725 B2
(45) Date of Patent: Aug. 4, 2026

(54) SEMICONDUCTOR DEVICE, MANUFACTURING METHOD THEREOF, AND 3D NAND MEMORY

(71) Applicant: Yangtze Memory Technologies Co., Ltd., Wuhan (CN)

(72) Inventors: Lu Zhou, Wuhan (CN); Quan Zhang, Wuhan (CN); Lan Yao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 683 days.

(21) Appl. No.: 18/166,100

(22) Filed: Feb. 8, 2023

(65) Prior Publication Data

US 2023/0253511 A1      Aug. 10, 2023

(30) Foreign Application Priority Data

Feb. 8, 2022    (CN) .......................... 202210119347.2

(51) Int. Cl.
H10D 1/66        (2025.01)
H10D 1/00        (2025.01)

(52) U.S. Cl.
CPC ............. H10D 1/665 (2025.01); H10D 1/047 (2025.01)

(58) Field of Classification Search
CPC ........ H10D 1/665; H10D 1/047; H10D 1/716; H01L 23/642; H10B 69/00
USPC ........................................................ 257/296
See application file for complete search history.

(56) References Cited

U.S. PATENT DOCUMENTS

| | | | | |
|---|---|---|---|---|
| 5,045,904 A * | 9/1991 | Kobayashi | ............. | H10D 1/665 |
| | | | | 257/305 |
| 5,821,579 A * | 10/1998 | Choi | .................. | H10B 12/0383 |
| | | | | 257/302 |
| 6,306,719 B1 * | 10/2001 | Lee | ...................... | H10B 12/036 |
| | | | | 438/455 |
| 2001/0039086 A1 * | 11/2001 | Sato | ........................ | H10B 12/09 |
| | | | | 257/E21.648 |
| 2002/0096704 A1 * | 7/2002 | Fukumoto | ............ | H10D 30/683 |
| | | | | 257/315 |

(Continued)

FOREIGN PATENT DOCUMENTS

| | | |
|---|---|---|
| CN | 103794543 A | 5/2014 |
| KR | 10-2006-0100778 A | 9/2006 |

OTHER PUBLICATIONS

Combined Chinese Office Action and Search Report issued on Nov. 19, 2025 in the corresponding Chinese Application No. 202210119347.2 (with English translation of Category of Cited Documents), 7 pages.

(Continued)

*Primary Examiner* — Sheikh Maruf
(74) *Attorney, Agent, or Firm* — Oblon, McClelland, Maier & Neustadt, L.L.P.

(57) ABSTRACT

This disclosure provides a semiconductor device, a method of manufacturing the same, a 3D NAND memory, and a memory system. The semiconductor device includes a substrate having a first trench at a surface thereof, and a first insulating layer formed on the surface of the substrate and inside the first trench. The first insulating layer formed inside the first trench forms a second trench that is embedded in the first trench. The semiconductor device further includes a conducting layer formed on a surface of the first insulating layer away from the substrate and inside the second trench.

18 Claims, 4 Drawing Sheets

(56) References Cited

U.S. PATENT DOCUMENTS

| | | | | | |
|---|---|---|---|---|---|
| 2002/0167046 | A1* | 11/2002 | Aoki | H10D 30/668 | 257/E21.384 |
| 2002/0195637 | A1* | 12/2002 | Kokubun | H10B 12/50 | 257/E21.396 |
| 2003/0116797 | A1* | 6/2003 | Park | H10D 1/047 | 257/E21.651 |
| 2005/0145912 | A1* | 7/2005 | Kidoh | H10B 12/37 | 257/E27.092 |
| 2005/0218442 | A1* | 10/2005 | Hieda | H10B 41/41 | 257/306 |
| 2005/0253188 | A1* | 11/2005 | Kito | H10B 12/0385 | 257/E21.651 |
| 2005/0287722 | A1* | 12/2005 | Zhang | H10D 30/0314 | 438/149 |
| 2006/0003578 | A1* | 1/2006 | Lee | H01L 21/76816 | 438/638 |
| 2006/0091549 | A1* | 5/2006 | Kojima | H10B 41/30 | 257/E27.081 |
| 2007/0069307 | A1* | 3/2007 | Eda | H10D 30/792 | 257/374 |
| 2009/0159883 | A1* | 6/2009 | Lee | H01L 22/34 | 257/773 |
| 2009/0194807 | A1* | 8/2009 | Takeuchi | H10B 69/00 | 257/E21.546 |
| 2009/0278193 | A1* | 11/2009 | Murata | H10D 30/681 | 257/E21.409 |
| 2012/0091518 | A1* | 4/2012 | Sukekawa | H10B 12/0335 | 257/296 |
| 2013/0306982 | A1* | 11/2013 | Kudou | H10D 30/668 | 438/589 |
| 2014/0097455 | A1* | 4/2014 | Ono | H10D 86/441 | 257/306 |
| 2016/0064333 | A1* | 3/2016 | Hu | H10W 20/425 | 438/653 |
| 2016/0233155 | A1* | 8/2016 | Lee | H01L 23/49838 | |
| 2018/0197996 | A1* | 7/2018 | Liu | H10D 30/6745 | |
| 2021/0249353 | A1* | 8/2021 | Sayama | H01L 21/764 | |
| 2022/0262894 | A1* | 8/2022 | Huang | H01L 23/5222 | |

OTHER PUBLICATIONS

Chinese Office Action dated Apr. 10, 2026, in Chinese Patent Application No. 202210119347.2, 7 pages.

* cited by examiner

900

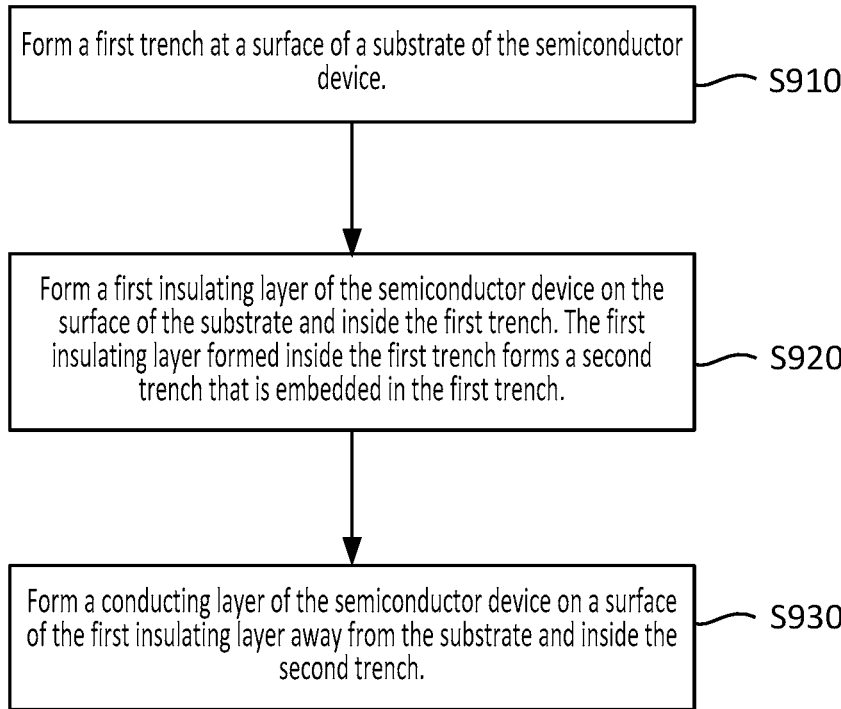

Form a first trench at a surface of a substrate of the semiconductor device. — S910

Form a first insulating layer of the semiconductor device on the surface of the substrate and inside the first trench. The first insulating layer formed inside the first trench forms a second trench that is embedded in the first trench. — S920

Form a conducting layer of the semiconductor device on a surface of the first insulating layer away from the substrate and inside the second trench. — S930

*FIG. 9*

SEMICONDUCTOR DEVICE, MANUFACTURING METHOD THEREOF, AND 3D NAND MEMORY

CROSS REFERENCE TO RELATED APPLICATION

The present disclosure claims priority to Chinese Patent Application No. 2022101193472, entitled "SEMICON-DUCTOR DEVICE, MANUFACTURING METHOD THEREOF, AND 3D NAND MEMORY", filed on Feb. 8, 2022. The entire disclosure of the prior application is hereby incorporated by reference in its entirety.

TECHNICAL FIELD

The present disclosure relates to the field of semiconductors, including a semiconductor device, a method of manufacturing the same, a 3D NAND memory, and a memory system.

BACKGROUND

In a manufacturing process of a semiconductor device, a part of the semiconductor is used to form capacitors. However, an integration degree of the capacitors in related arts is low, limiting a size reduction of the semiconductor device.

The above information disclosed in the background section is only for enhancement of understanding of the background of the technology described in this disclosure, and certain information may be included in the background that does not form the prior art that is already known in this country to a person skilled in the art.

SUMMARY

This disclosure provides a semiconductor device including a substrate having a first trench at a surface thereof and a first insulating layer formed on the surface of the substrate and inside the first trench. The first insulating layer formed inside the first trench forms a second trench that is embedded in the first trench. The semiconductor device further includes a conducting layer formed on a surface of the first insulating layer away from the substrate and inside the second trench.

In an embodiment, a surface of the conducting layer away from the second trench is a planar surface.

In an embodiment, the first insulating layer inside the first trench is formed on a bottom and a sidewall of the first trench.

In an embodiment, a thickness of the first insulating layer formed on the bottom of the first trench is a first thickness, and a thickness of the first insulating layer formed on the surface of the substrate is a second thickness. The first thickness is greater than or equal to the second thickness.

According to aspects of the disclosure, the semiconductor device further includes a second insulating layer formed inside the first trench. The first insulating layer formed inside the first trench is formed on the second insulating layer.

In an embodiment, a thickness of the first insulating layer formed on the second insulating layer is a first thickness, and a thickness of the first insulating layer formed on the surface of the substrate is a second thickness. A sum of the first thickness and a thickness of the second insulating layer is greater than the second thickness.

In an embodiment, the first insulating layer and the second insulating layer include a same material.

This disclosure further provides a method for manufacturing a semiconductor device. Under the method, a first trench is formed at a surface of a substrate of the semiconductor device. A first insulating layer of the semiconductor device is formed on the surface of the substrate and inside the first trench. The first insulating layer formed inside the first trench forms a second trench that is embedded in the first trench. A conducting layer of the semiconductor device is formed on a surface of the first insulating layer away from the substrate and inside the second trench.

In an embodiment, to form the first trench of the substrate, a patterned mask layer is first formed on the surface of the substrate. Then, the substrate is etched by taking the patterned mask layer as a mask to form the first trench of the substrate.

In an embodiment, the first insulating layer is formed on a bottom and a sidewall of the first trench.

In an embodiment, a thickness of the first insulating layer formed on the bottom of the first trench is a first thickness, and a thickness of the first insulating layer formed on the surface of the substrate is a second thickness. The first thickness is greater than or equal to the second thickness.

In an embodiment, to form the conducting layer, a preparation conducting layer is first formed on the surface of the first insulating layer away from the substrate and inside the second trench. The preparation conducting layer inside the second trench fills the second trench. Then, the preparation conducting layer is flattened such that a surface of the residual preparation conducting layer away from the substrate is flattened to be a planar surface, to form the conducting layer.

According to aspects of the disclosure, under the method, a second insulating layer of the semiconductor device is formed inside the first trench. The first insulating layer formed inside the first trench is formed on the second insulating layer.

In an embodiment, to form the second insulating layer, an isolation material is first filled into the first trench. Then, at least a part of the isolation material is removed to form the second insulating layer.

In an embodiment, the first insulating layer and the second insulating layer include a same material.

In an embodiment, a thickness of the first insulating layer formed on the second insulating layer is a first thickness, and a thickness of the first insulating layer formed on the surface of the substrate is a second thickness. A sum of the first thickness and a thickness of the second insulating layer is greater than the second thickness.

This disclosure also provides a semiconductor device including a substrate and a conducting layer formed on the substrate. The substrate includes a first portion and multiple separate second portions on the first portion along a vertical direction of the semiconductor device. A part of the conducting layer is formed between two adjacent second portions of the substrate. The semiconductor further includes a first insulating layer formed between the substrate and the conducting layer.

In an embodiment, projections of the part of the conducting layer and the two adjacent second portions overlap to each other along a horizontal direction of the semiconductor device.

In an embodiment, the first insulating layer is formed on a surface of the first portion and on surfaces and sidewalls of the multiple separate second portions of the substrate.

In an embodiment, the semiconductor device includes a second insulating layer formed between the substrate and the first insulating layer.

BRIEF DESCRIPTION OF THE DRAWINGS

The accompanying drawings of the specification, which form a part of the application, are used to provide a further understanding of the application. The illustrative embodiments and descriptions of the application are used to explain the application and do not constitute an improper limitation of the application. In the attached figure:

FIG. 9 shows another flow diagram of a manufacturing method of the semiconductor device according to the present disclosure.

DETAILED DESCRIPTION

Figures 1, 2, 3:
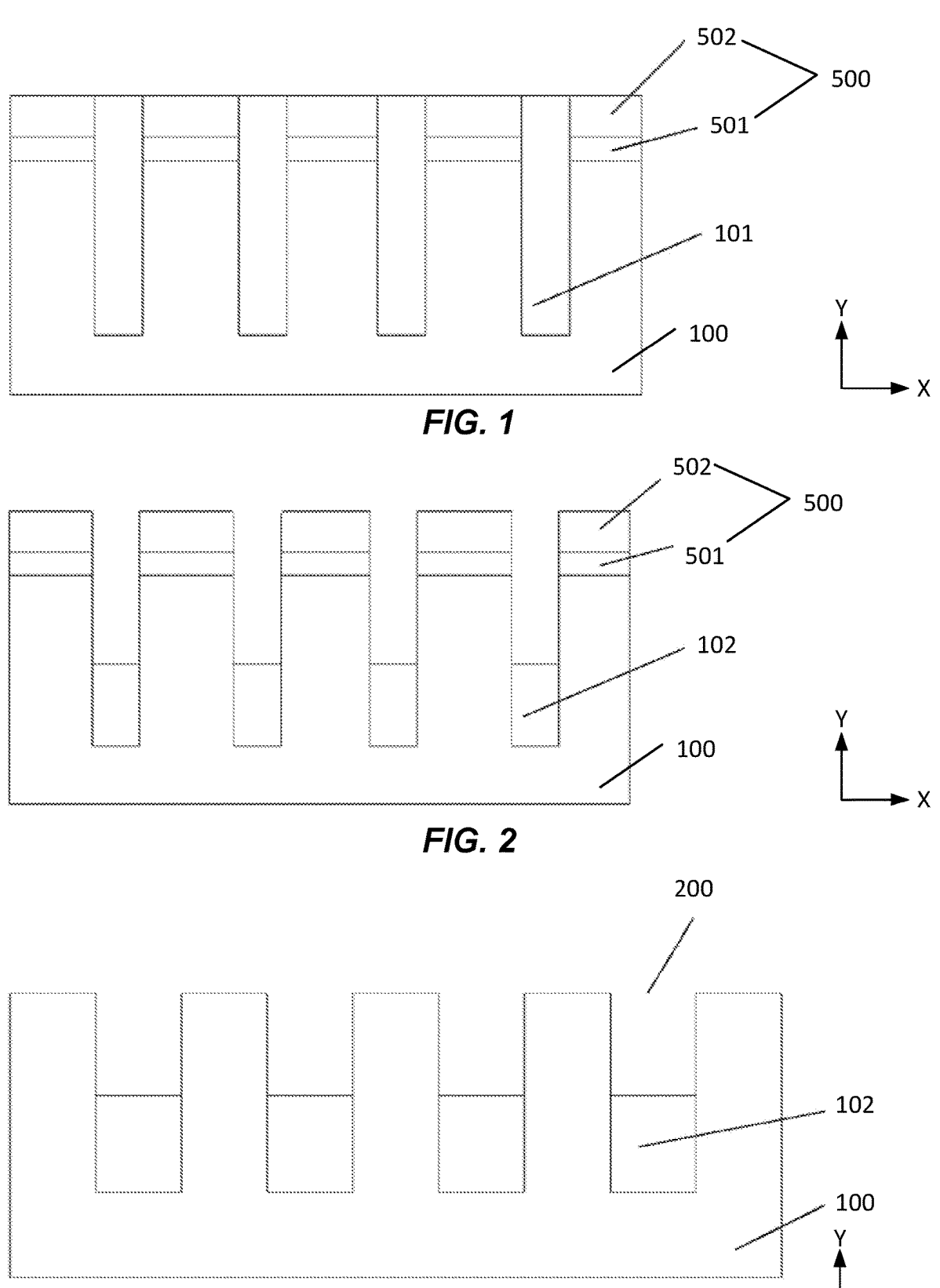
FIGS. 1 to 6 show different process steps of a semiconductor process according to the present disclosure.

It should be noted that the following detailed description is exemplary and is intended to provide further explanation of the disclosure. Unless defined otherwise, all technical and scientific terms used herein have the same meaning as commonly understood by those skilled in the art to which this application belongs.

It is noted that the terminology used herein is for the purpose of describing particular embodiments only and is not intended to limit exemplary embodiments of the present disclosure. As used herein, the singular forms of "a", "an", and "the" are intended to include the plural forms, unless the context clearly indicates otherwise. It should be understood that the terms "comprises" and/or "comprising" used in this specification specify the presence of stated features, steps, operations, devices, components, and/or combinations thereof.

It should be noted that the embodiments and features of the embodiments in the present disclosure may be combined with each other without conflict. The present disclosure will be described in detail below with reference to the drawings and embodiments.

In order to make the technical solutions of the present disclosure better understood by those skilled in the art, the technical solutions in the embodiments of the present disclosure will be clearly described below with reference to the drawings. It is noted that the described embodiments are only some embodiments of the present disclosure, and not all embodiments. All other embodiments, which can be derived by a person skilled in the art from the embodiments given herein, shall fall within the protection scope of the present disclosure.

It should be noted that the terms "first," "second," and the like in the description, in the claims of this disclosure, and in the drawings described above are used for distinguishing between similar elements and not necessarily for describing a particular sequential or chronological order. It should be understood that the data so used may be interchanged under appropriate circumstances such that embodiments of the application described herein may be used. Furthermore, the terms "comprises", "comprising", "having", and any variations thereof, are intended to cover a non-exclusive inclusion, such that a process, method, system, product, or apparatus that comprises a list of steps or elements is not necessarily limited to those steps or elements explicitly listed, but may include other steps or elements not explicitly listed or inherent to such process, method, product, or apparatus.

It should be understood that when an element such as a layer, film, region, or substrate is referred to as being "on" another element, it can be directly on the other element or an intervening element may also be present between the two elements. Also, in the specification and claims, when an element is described as being "connected" to another element, the element may be "directly connected" to the other element or "connected" to the other element through a third element.

As described in the background, in the related art, an occupied area of a capacitor in a semiconductor device is large, limiting the size reduction of the semiconductor device. To solve this problem, the present disclosure provides a semiconductor device, a method of manufacturing the same, a 3D NAND memory, and a memory system.

Figure 7:
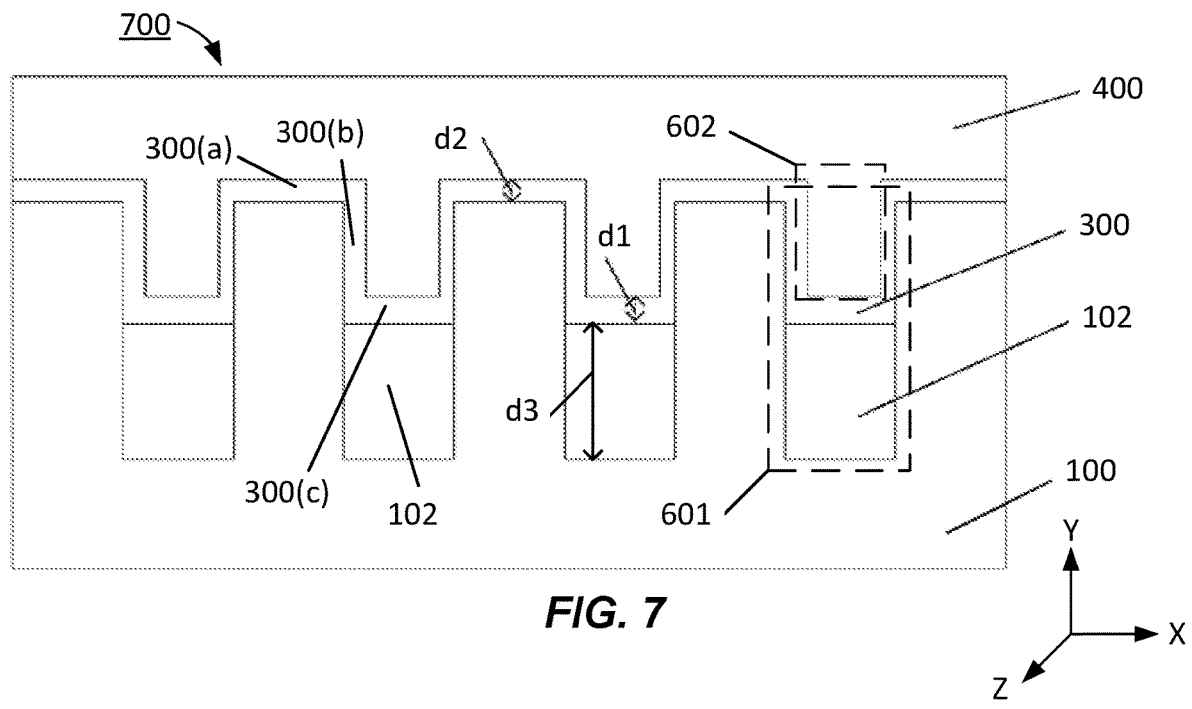
FIG. 7 shows a schematic diagram of a semiconductor device according to the present disclosure.
Figure 8:
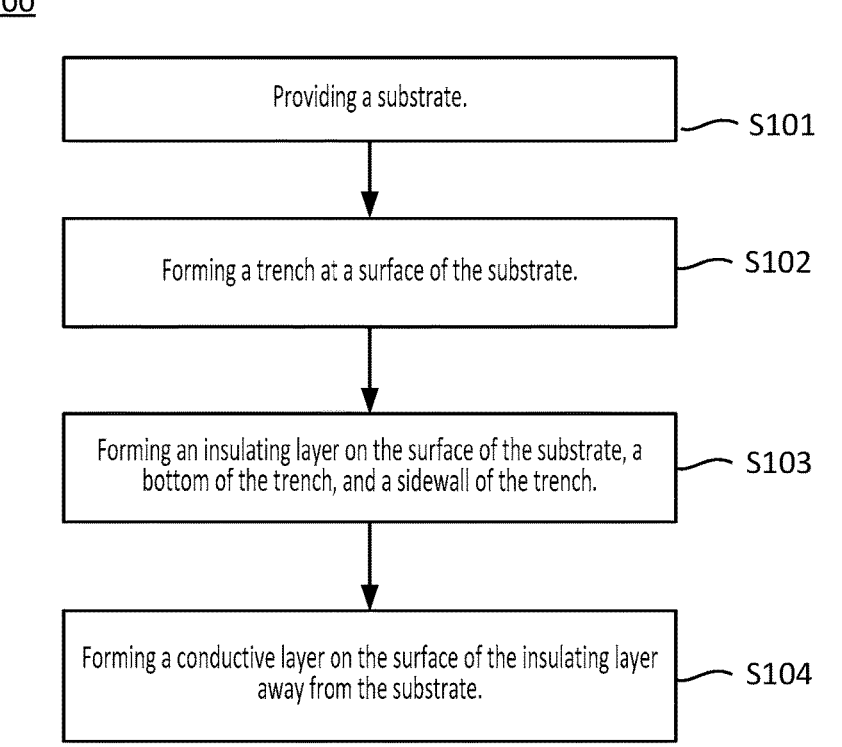
FIG. 8 shows a flow diagram of a manufacturing method of the semiconductor device according to the present disclosure.

According to an exemplary embodiment in FIG. 7, a semiconductor device 700 can include a substrate 100, a first insulating layer 300, and a conducting layer 400. The substrate 100 can have a first trench 601 at a surface thereof. The first insulating layer 300 can be formed on the surface of the substrate 100 and inside the first trench 601. The first insulting layer 300 formed inside the first trench 601 can form a second trench 602. The conducting layer 400 can be located on a surface of the first insulating layer 300 away from the substrate 100 and inside the second trench 602. The substrate 100, the first insulating layer 300, and the conducting layer 400 can form a capacitor. Specifically, the substrate 100 and the conducting layer 400 can be two conducting plates of the capacitor, and the first insulating layer 300 can be the insulating layer of the capacitor between the two conducting plates.

Compared with the related arts in which a capacitor with a two-dimensional planar structure occupies a large area, the substrate 100 of the semiconductor device 700 provided in this disclosure can have a three-dimensional planar structure due to the first trench 601 of the substrate 100, so that the conducting layer 400 covering the substrate 100 can have a three-dimensional planar structure in X-Z plane. Therefore, the capacitor can be formed with a three-dimensional planar structure, and the occupied area of the capacitor becomes smaller, under the condition that the effective area of the capacitor is not changed. By implementing the capacitor, the integration density of the semiconductor device 700 can be improved, and the problem that the size reduction of the semiconductor device 700 is limited by the capacitor can be solved.

It is noted that the substrate 100 of the semiconductor can have one or more first trenches 601.

In an embodiment, the conducting layer 400 can fill into the second trench 602. A surface of the conducting layer 400 away from the substrate 100 can be flattened to be a planar surface.

In the embodiment, the semiconductor device 700 can further includes a second insulating layer 102 that is formed inside the first trench 601 and underneath the first insulating layer 300. That is, the second insulating layer 102 can be formed between the first insulating layer 300 and the substrate 100.

In the embodiment, the first insulating layer 300, such as the insulating layer 300(*a*), 300(*b*), and 300(*c*), can be formed on a surface of the substrate 100, a sidewall of the first trench 601, and a surface of the second insulating layer 102, respectively. A thickness of the first insulating layer 300 formed on the surface of the second insulating layer 102 is a first thickness d1, a thickness of the first insulating layer 300 formed on the surface of the substrate 100 is a second thickness d2, and a thickness of the second insulating layer 102 is a third thickness d3. In an example, the first thickness d1 can be equal to the second thickness d2. In an example, a sum of the first thickness d1 and the third thickness d3 is greater than the second thickness d2. In an example, the first insulating layer 300 and the second insulating layer 102 can include a same material.

Figures 4, 5, 6:
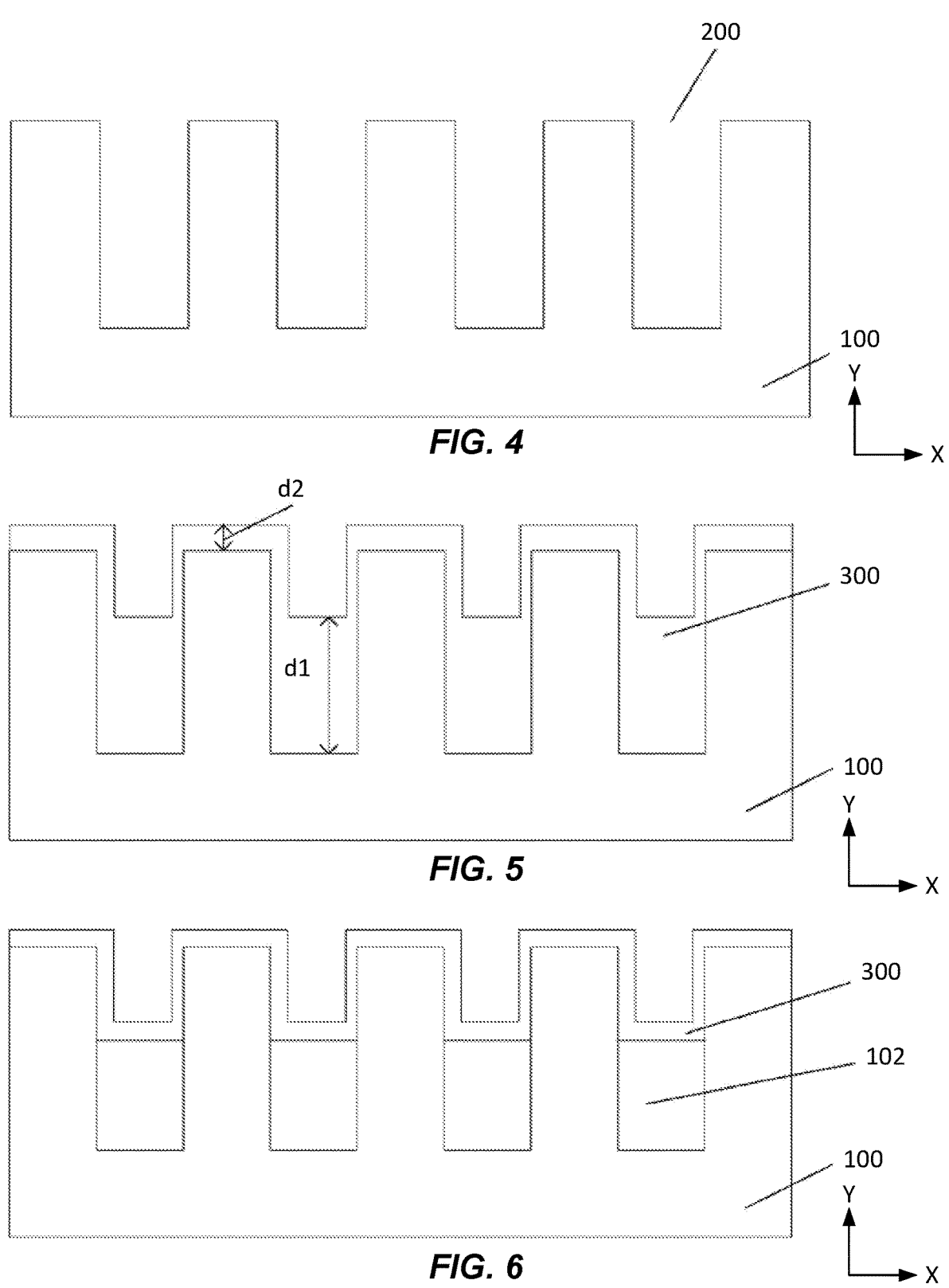

According to aspects of the disclosure, the first insulating layer 300 formed inside the first trench 601 can be formed on a bottom of the first trench 601, as shown in FIG. 5. In such a case, the first thickness d1 can be greater than or equal to the second thickness d2.

It is noted that a comparison between the first thickness d1 and the second thickness d2 is not limited to the above descriptions, and can be set according to various situations.

In addition, materials of the conducting layer 400, the substrate 100, the first insulating layer 300, and the second insulating layer 102 are not limited in this disclosure and can be set according to various situations. In an example, the conducting layer 400 can include polysilicon, the substrate 100 can include silicon, and both the first and second insulating layers 300 and 102 can include silicon oxide.

This disclosure further provides a method 800 of manufacturing a semiconductor device such as the semiconductor 700. The method includes the following steps:

At step S101, providing a substrate.

At step S102, forming a trench at a surface of the substrate.

At step S103, forming an insulating layer on the surface of the substrate, a bottom of the trench, and a sidewall of the trench.

At step S104, forming a conductive layer on the surface of the insulating layer away from the substrate.

In the method 800, a substrate such as the substrate 100 first is provided; then a trench such as the trench 200 in FIG. 3 or FIG. 4 is formed at the surface of the substrate; and finally, an insulating layer and a conducting layer are sequentially formed on the substrate with the trench to obtain the semiconductor device such as the semiconductor device 700 in FIG. 7. According to the method 800, the three-dimensional trench is formed on the substrate, and the insulating layer and the conducting layer are sequentially formed on the surface of the substrate and inside the trench. Accordingly, in the X-Z plane, the conducting layer is changed into a three-dimensional planar structure from a two-dimensional planar structure in the relate arts, and the capacitor with the three-dimensional planar structure can be obtained. The occupied area of the capacitor in the semiconductor device becomes smaller under the condition that the effective area of the capacitor is not changed, the integration density of the semiconductor device can be improved, and the problem of limitation of the capacitor on size reduction of the semiconductor device can be solved.

In an embodiment, providing the substrate includes filling an isolation material into the first trench 601 to form a trench isolation structure 101, as shown in FIG. 1. Then, at least a portion of the trench isolation structure 101 can be removed to form the trench 200, as shown in FIG. 3 or FIG. 4. In FIG. 3, a part of the trench isolation structure 101 is removed and the remaining trench isolation structure can form the second insulating layer 102. In FIG. 4, all the trench isolation structure 101 is removed.

In an embodiment, forming the trench isolation structure 101 includes: forming a patterned mask layer 500 on the substrate 100; etching the substrate 100 by using the patterned mask layer 500 as a mask to obtain the first trench 601; filling the isolation material on a surface of the patterned mask layer 500 away from the substrate 100 and inside the first trench 601; and removing the isolation material on the surface of the patterned mask layer 500 so that the patterned mask layer 500 is exposed, resulting in the trench isolation structure 101 in FIG. 1.

In an embodiment, removing at least a portion of the trench isolation structure 101 to form the trench 200 includes: removing at least a portion of the trench isolation structure 101, as shown in FIG. 2; and removing the patterned mask layer 500 to obtain the trench 200 as shown in FIG. 3 or FIG. 4. In FIG. 3, a part of the trench isolation structure 101 is removed and the remaining part of the trench isolation structure forms the second insulating layer 102. In FIG. 4, all the trench isolation structure is removed.

In an embodiment, the trench 200 is formed by etching the substrate through a dry etching method.

In an embodiment, the substrate 100 can be a silicon substrate, a germanium substrate, a silicon germanium (SiGe) substrate, an SOI (silicon on insulator) substrate, or a GOI (germanium on insulator) substrate.

In an embodiment, the substrate 100 can include compound semiconductor materials, such as GaAs, InP, SiC, and/or the like.

In an embodiment, the substrate 100 can have a stacked structure, such as Si/SiGe, or the like, and can have an epitaxial structure, such as SGOI (silicon germanium on insulator) or the like.

In an embodiment, forming the patterned mask layer 500 includes: sequentially forming a mask material layer and a photoresist layer on the surface of the substrate 100; patterning the photoresist layer, wherein the residual photoresist layer forms a photoresist part; etching the mask material layer by using the photoresist part as a mask to form the patterned mask layer; and removing the photoresist part.

In an embodiment, the patterned mask layer 500 includes a first mask layer 501 and a second mask layer 502 sequentially stacked along a vertical direction (Y direction) away from the substrate, as shown in FIG. 1. In an example, the first mask layer 501 includes silicon oxide, and the second mask layer 502 includes silicon nitride.

It is noted that the first mask layer and the second mask layer are not limited to the silicon oxide and the silicon nitride. In an embodiment, in order to form a relatively stable patterned mask layer and ensure a better etching effect, the first mask layer includes carbon, and the second mask layer includes silicon oxynitride.

In an embodiment, forming the masking material layer in the method 800 on the surface of the substrate includes: forming a silicon oxide layer on the surface of the substrate; and forming a silicon nitride layer on the surface of the silicon oxide layer. The mask material layer of the present disclosure is not limited to the above-mentioned forming method, and other forming methods can be adopted, and those skilled in the art can select appropriate materials and processes according to actual situations to form the mask material layer of the present disclosure.

In an embodiment, the material of the insulating layer is the same as that of the isolation material.

In an embodiment, the forming the conducting layer on the surface of the insulating layer away from the substrate includes: forming a preparatory conducting layer on the surface of the insulating layer far away from the substrate, wherein the preparatory conducting layer fills the trench; and planarizing the preliminary conducting layer so that the surface of the remaining preliminary conducting layer, which is away from the substrate, becomes a planar surface, thereby obtaining the conducting layer.

These structural layers described above can be formed by one or more of molecular beam epitaxy (MBE), metal organic chemical vapor deposition (MOCVD), metal organic vapor phase epitaxy (MOVPE), hydride vapor phase epitaxy (HVPE), and/or other crystal growth processes.

This disclosure further provides a process 900 for manufacturing a semiconductor device such as the semiconductor device 700, as shown in FIG. 9.

At step S910, the process 900 forms a first trench (e.g., the first trench 601) at a surface of a substrate (e.g., the substrate 100) of the semiconductor device.

At step S920, the process 900 forms a first insulating layer (e.g., the first insulating layer 300) of the semiconductor device on the surface of the substrate and inside the first trench. The first insulating layer formed inside the first trench forms a second trench (e.g., the second trench 602) that is embedded in the first trench.

At step S930, the process 900 forms a conducting layer (e.g., the conducting layer 400) of the semiconductor device on a surface of the first insulating layer away from the substrate and inside the second trench.

In an embodiment, to form the first trench of the substrate, the process 900 forms a patterned mask layer (e.g., the patterned mask layer 500) on the surface of the substrate. Then, the process 900 etches the substrate by taking the patterned mask layer as a mask to form the first trench of the substrate.

In an embodiment, the first insulating layer is formed on a bottom and a sidewall of the first trench.

In an embodiment, a thickness of the first insulating layer formed on the bottom of the first trench is a first thickness, and a thickness of the first insulating layer formed on the surface of the substrate is a second thickness. The first thickness is greater than or equal to the second thickness.

In an embodiment, to form the conducting layer, the process 900 forms a preparation conducting layer on the surface of the first insulating layer away from the substrate and inside the second trench. The preparation conducting layer inside the second trench fills the second trench. Then, the process 900 flattens the preparation conducting layer such that a surface of the residual preparation conducting layer away from the substrate is flattened to be a planar surface, to form the conducting layer.

According to aspects of the disclosure, the process 900 can form a second insulating layer (e.g., the second insulating layer 102) of the semiconductor device inside the first trench. The first insulating layer formed inside the first trench is formed on the second insulating layer.

In an embodiment, to form the second insulating layer, the process 900 fills an isolation material into the first trench. Then, the process 900 removes at least a part of the isolation material to form the second insulating layer.

In an embodiment, the first insulating layer and the second insulating layer include a same material.

In an embodiment, a thickness of the first insulating layer formed on the second insulating layer is a first thickness, and a thickness of the first insulating layer formed on the surface of the substrate is a second thickness. A sum of the first thickness and a thickness of the second insulating layer is greater than the second thickness.

This disclosure also provides a 3D NAND memory including any one of the above semiconductor devices or a semiconductor device manufactured by any one of the above methods.

The semiconductor device includes a substrate, an insulating layer, and a conducting layer. The surface of the substrate has a trench. The insulating layer covers the surface of the substrate, the bottom of the trench, and the sidewall of the trench. The conducting layer is located on the surface of the insulating layer away from the substrate. Compared with the problem that a capacitor with a two-dimensional plane structure occupies a large area in the related art, the semiconductor device provided in the disclosure forms the three-dimensional planar structure with a plurality of trenches on the substrate, so that the conducting layer covering the substrate has a three-dimensional planar structure. Accordingly, the capacitor with the three-dimensional planar structure is formed, the occupied area of the capacitor (and the semiconductor device) becomes smaller under the condition that the effective area of the capacitor (and the semiconductor device) is not changed, the integration density of the semiconductor device is improved, the problem that the size reduction of the semiconductor device is limited by the capacitor is solved, and the size of the 3D NAND memory can become smaller.

This disclosure provides a memory system including the 3D NAND memory described above and a memory controller, the 3D NAND memory configured to store data, the memory controller coupled to the 3D NAND memory and configured to control the 3D NAND memory.

The storage system includes the storage controller and the 3D NAND memory, wherein the semiconductor device in the 3D NAND memory is formed with a three-dimensional pattern with a plurality of trenches on a substrate, so that the conducting layer covering on the substrate can have a three-dimensional planar structure. Accordingly, a capacitor with a three-dimensional planar structure is formed, the occupied area of the capacitor becomes smaller under the condition that the effective area of the capacitor is not changed, the integration density of the semiconductor device is improved, the problem of limitation of the capacitor on size reduction of the semiconductor device is relieved, the size of the 3D NAND memory can become smaller, and the size of the storage system can be smaller too.

In the above embodiments of the present disclosure, the descriptions of the respective embodiments have respective emphasis, and for parts that are not described in detail in a certain embodiment, reference may be made to related descriptions of other embodiments.

From the above description, it can be seen that the above-described embodiments of the present disclosure achieve the following technical effects:

1) the semiconductor device comprises a substrate, an insulating layer, and a conducting layer. A trench is formed at the surface of the substrate. The insulating layer covers the surface of the substrate, the bottom of the trench and the side wall of the trench. The conducting layer is located on the surface of the insulating layer far away from the substrate. Compared with the problem that a capacitor with a two-dimensional planar structure occupies a large area in the related arts, the semiconductor device in the present disclosure forms the three-dimensional planar structure with the trench of the substrate, so that the conducting layer covering the substrate has a three-dimensional planar structure. Accordingly, the capacitor with the three-dimensional planar structure is formed, the occupied area of the capacitor becomes smaller under the condition that the effective area of the capacitor is not changed, the integration density of the semiconductor device can be improved, and the problem that the size reduction of the semiconductor device is limited by the capacitor is solved.

2) In the method for manufacturing the semiconductor device, a substrate is provided; then forming a trench on the surface of the substrate; and finally, sequentially covering an insulating layer and a conducting layer on the substrate with the trench to obtain the semiconductor device. According to the method, the three-dimensional planar structure with the trench is formed on the substrate, and the insulating layer and the conducting layer are sequentially formed on the surface of the substrate and inside the trench, so that the conducting layer is changed into a three-dimensional planar structure from the two-dimensional planar structure in the related arts, the capacitor with the three-dimensional structure is obtained, the occupied area of the capacitor in the semiconductor device becomes smaller under the condition that the effective area of the capacitor is not changed, the integration density of the semiconductor device can be improved, and the problem of limitation of the capacitor on size reduction of the semiconductor device is solved.

3) The 3D NAND memory of the present disclosure includes any one of the semiconductor devices or the semiconductor device manufactured by any one of the methods. The semiconductor device includes a substrate, an insulating layer, and a conducting layer. The substrate has a trench on a surface thereof, the insulating layer covers the surface of the substrate, a bottom of the trench, and a sidewall of the trench, and the conducting layer is located on a surface of the insulating layer away from the substrate. Compared with the problem that a capacitor with a two-dimensional planar structure occupies a large area in the related arts, the semiconductor device provided in the present disclosure forms the three-dimensional planar structure with a plurality of trenches at the substrate, so that the conducting layer covering the substrate has a three-dimensional planar structure. Accordingly, the capacitor with the three-dimensional structure is formed, the occupied area of the semiconductor device becomes smaller in the semiconductor device under the condition that the effective area of the capacitor is not changed, the integration density of the semiconductor device can be improved, the problem that the size reduction of the semiconductor device is limited by the capacitor is solved, and the size of the 3D NAND memory becomes smaller.

4) The storage system comprises the storage controller and the 3D NAND memory, wherein the semiconductor device in the 3D NAND memory is formed with a three-dimensional planar structure with a plurality of trenches on a substrate, so that the conducting layer covering the substrate has a three-dimensional planar structure. Accordingly, a capacitor with a three-dimensional planar structure is formed, the occupied area of the capacitor becomes smaller under the condition that the effective area of the capacitor is not changed, the integration density of the semiconductor device can be improved, the problem of limitation of the capacitor on size reduction of the semiconductor device is relieved, the size of the 3D NAND memory becomes smaller, and the size of the storage system becomes smaller too.

The above description is only a preferred embodiment of the present disclosure and is not intended to limit the present disclosure, and various modifications and changes may be made by those skilled in the art. Any modification, equivalent replacement, improvement and the like made within the spirit and principle of the present disclosure shall be included in the protection scope of the present disclosure.

What is claimed is:

1. A semiconductor device, comprising:
a substrate having a first trench at a surface thereof;
a first insulating layer formed on the surface of the substrate and inside the first trench, the first insulating layer formed inside the first trench forming a second trench that is embedded in the first trench;
a second insulating layer formed inside the first trench, wherein the first insulating layer formed inside the first trench is formed on the second insulating layer; and
a conducting layer formed on a surface of the first insulating layer away from the substrate and inside the second trench,
wherein a thickness of the first insulating layer formed on the second insulating layer is a first thickness, a thickness of the first insulating layer formed on the surface of the substrate is a second thickness, and a sum of the first thickness and a thickness of the second insulating layer is greater than the second thickness.

2. The semiconductor device of claim 1, wherein a surface of the conducting layer away from the second trench is a planar surface.

3. The semiconductor device of claim 1, wherein the first insulating layer inside the first trench is formed on a bottom and a sidewall of the first trench.

4. The semiconductor device of claim 1, wherein the first insulating layer and the second insulating layer include a same material.

5. A semiconductor device, comprising:
a substrate including a first portion and multiple separate second portions on the first portion along a vertical direction of the semiconductor device;
a conducting layer formed on the substrate along the vertical direction of the semiconductor device, a part of the conducting layer being formed between two adjacent second portions of the substrate along a horizontal direction of the semiconductor device;
a first insulating layer formed between the substrate and the conducting layer along the vertical direction of the semiconductor device; and
a second insulating layer formed between a bottom of the first insulating layer and the first portion of the substrate,
wherein a thickness of the first insulating layer formed on the second insulating layer is a first thickness, a thickness of the first insulating layer formed on a surface of second portions of the substrate is a second thickness, and a sum of the first thickness and a thickness of the second insulating layer is greater than the second thickness.

6. The semiconductor device of claim 5, wherein projections of the part of the conducting layer and the two adjacent second portions overlap to each other along the horizontal direction of the semiconductor device.

7. The semiconductor device of claim 5, wherein the first insulating layer is formed on a surface of the first portion and on surfaces and sidewalls of the multiple separate second portions of the substrate.

8. The semiconductor device of claim 5,
wherein the second insulating layer is formed between the substrate and the first insulating layer along the vertical direction of the semiconductor device.

9. The semiconductor device of claim 5, wherein a surface of the part of the conducting layer is a planar surface.

10. The semiconductor device of claim 5, wherein the first insulating layer and the second insulating layer include a same material.

11. The semiconductor device of claim 5, wherein the conducting layer includes polysilicon.

12. The semiconductor device of claim 5, wherein the first insulating layer includes silicon oxide.

13. The semiconductor device of claim 5, wherein the second insulating layer includes silicon oxide.

14. The semiconductor device of claim 5, wherein the substrate includes silicon.

15. The semiconductor device of claim 1, wherein the conducting layer includes polysilicon.

16. The semiconductor device of claim 1, wherein the first insulating layer includes silicon oxide.

17. The semiconductor device of claim 1, wherein the second insulating layer includes silicon oxide.

18. The semiconductor device of claim 1, wherein the substrate includes silicon.

*     *     *     *     *